(12) United States Patent
Hwang et al.

(10) Patent No.: US 10,396,037 B2
(45) Date of Patent: Aug. 27, 2019

(54) FAN-OUT SEMICONDUCTOR DEVICE

(71) Applicant: SAMSUNG ELECTRO-MECHANICS CO., LTD., Suwon-Si, Gyeonggi-Do (KR)

(72) Inventors: Jun Oh Hwang, Suwon-si (KR); Kwang Yun Kim, Suwon-si (KR); Ki Jung Sung, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/713,200

(22) Filed: Sep. 22, 2017

(65) Prior Publication Data

US 2018/0350747 A1 Dec. 6, 2018

(30) Foreign Application Priority Data

Jun. 5, 2017 (KR) .................. 10-2017-0069756

(51) Int. Cl.
*H01L 23/538* (2006.01)
*H01L 23/13* (2006.01)
(Continued)

(52) U.S. Cl.
CPC .......... *H01L 23/5386* (2013.01); *H01L 23/13* (2013.01); *H01L 23/3128* (2013.01); *H01L 23/367* (2013.01); *H01L 23/481* (2013.01); *H01L 23/5384* (2013.01); *H01L 23/5389* (2013.01); *H01L 23/552* (2013.01); *H01L 24/05* (2013.01); *H01L 24/24* (2013.01); *H01L 23/3677* (2013.01); *H01L 24/13* (2013.01); *H01L 24/16* (2013.01); *H01L 24/19* (2013.01); *H01L 2224/02379* (2013.01); *H01L 2224/0401* (2013.01); *H01L 2224/05024* (2013.01); *H01L 2224/13023* (2013.01); *H01L 2224/13024* (2013.01); *H01L 2224/16227* (2013.01); *H01L 2224/18* (2013.01); *H01L 2224/2401* (2013.01);
(Continued)

(58) Field of Classification Search
CPC . H01L 23/5386; H01L 23/13; H01L 23/3128; H01L 23/12; H01L 23/481
See application file for complete search history.

(56) References Cited

U.S. PATENT DOCUMENTS

2006/0128069 A1 6/2006 Hsu
2011/0241168 A1 10/2011 Kim et al.
(Continued)

FOREIGN PATENT DOCUMENTS

KR    10-1685501 B1    12/2016
TW    201214626 A    4/2012

OTHER PUBLICATIONS

Taiwanese Office Action issued in corresponding Taiwanese Patent Application No. 106133462, dated Mar. 20, 2018, with English Translation.

*Primary Examiner* — Wael M Fahmy
*Assistant Examiner* — Sarah K Salerno
(74) *Attorney, Agent, or Firm* — Morgan, Lewis & Bockius LLP

(57) ABSTRACT

There is provided a fan-out semiconductor device in which a first package having a semiconductor chip disposed therein and having a fan-out form and a second package having a passive component disposed therein and having a fan-out form are stacked in a vertical direction so that the semiconductor chip and the passive component are electrically connected to each other by a path as short as possible.

21 Claims, 12 Drawing Sheets

(51) Int. Cl.
    *H01L 23/31*      (2006.01)
    *H01L 23/00*      (2006.01)
    *H01L 23/48*      (2006.01)
    *H01L 23/367*     (2006.01)
    *H01L 23/552*     (2006.01)

(52) U.S. Cl.
    CPC ............... *H01L 2224/24195* (2013.01); *H01L 2224/24225* (2013.01); *H01L 2224/24265* (2013.01); *H01L 2924/14* (2013.01); *H01L 2924/15153* (2013.01); *H01L 2924/19041* (2013.01); *H01L 2924/19102* (2013.01); *H01L 2924/19105* (2013.01); *H01L 2924/301* (2013.01); *H01L 2924/3025* (2013.01)

(56) References Cited

U.S. PATENT DOCUMENTS

| | | |
|---|---|---|
| 2012/0056329 A1 | 3/2012 | Pagaila et al. |
| 2017/0033090 A1 | 2/2017 | Hsieh et al. |

I-I'

FAN-OUT SEMICONDUCTOR DEVICE

CROSS-REFERENCE TO RELATED APPLICATION(S)

This application claims benefit of priority to Korean Patent Application No. 10-2017-0069756 filed on Jun. 5, 2017 in the Korean Intellectual Property Office, the disclosure of which is incorporated herein by reference in its entirety.

BACKGROUND

1. Field

The present disclosure relates to a semiconductor device, and more particularly, to a fan-out semiconductor device in which connection terminals may extend outwardly of a region in which a semiconductor chip is disposed.

2. Description of Related Art

Recently, display functions and designs of flagship mobile products, and the like, have become important, and the miniaturization of flagship mobile products, and the like, has been required for the purpose of differentiation of designs. In the related art, a chip-on-board (COB) manner of mounting a semiconductor chip and a passive component on a printed circuit board (PCB) using surface mounting technology (SMT) has been generally used. However, in this case, an interval between components needs to be reduced in order to miniaturize a device (reduce an X-Y area), and thus, there is a limitation.

SUMMARY

An aspect of the present disclosure may provide a semiconductor device capable of being miniaturized as compared to a chip-on-board (COB) according to the related art and having a large advantage in terms of a reduction in noise by significantly reducing a signal path between a semiconductor chip and a passive component.

According to an aspect of the present disclosure, a fan-out semiconductor device may be provided, in which a fan-out semiconductor package having a semiconductor chip disposed therein and a fan-out component package having a passive component disposed therein are stacked in a vertical direction so that the semiconductor chip and the passive component are electrically connected to each other by a path as short as possible.

According to an aspect of the present disclosure, a fan-out semiconductor device may include: a fan-out semiconductor package including a first connection member having a first through-hole, a semiconductor chip disposed in the first through-hole and having an active surface having connection pads disposed thereon and an inactive surface opposing the active surface, a first encapsulant encapsulating at least portions of the semiconductor chip, and a second connection member disposed on the first connection member and the active surface of the semiconductor chip, the first and second connection members including, respectively, redistribution layers electrically connected to the connection pads; and a fan-out component package including a third connection member having a second through-hole, a first passive component disposed in the second through-hole, a second encapsulant encapsulating at least portions of the first passive component, and a fourth connection member disposed on the third connection member and the first passive component, the third and fourth connection members including, respectively, redistribution layers electrically connected to the connection pads. The fan-out semiconductor package is stacked on the fan-out component package so that the second connection member faces the fourth connection member, and the connection pads are electrically connected to the first passive component through the second and fourth connection members.

According to another aspect of the present disclosure, a fan-out semiconductor device may include: a fan-out semiconductor package including a first connection member having a first through-hole, a semiconductor chip disposed in the first through-hole and having an active surface having connection pads disposed thereon and an inactive surface opposing the active surface, a first encapsulant encapsulating at least portions of the semiconductor chip, and a second connection member disposed on the first connection member and the active surface of the semiconductor chip, the first and second connection members including, respectively, redistribution layers electrically connected to the connection pads; and a fan-out substrate including a third connection member having a second through-hole, a second encapsulant covering the third connection member and blocking one side of the second through-hole, and a fourth connection member disposed on the third connection member and having a third through-hole extending from the other side of the second through-hole, the third and fourth connection members including, respectively, redistribution layers electrically connected to the connection pads. The fan-out semiconductor package is stacked on the fan-out substrate so that the second connection member faces the fourth connection member, a passive component electrically connected to the second connection member are disposed in the second and third through-holes, and the passive component is physically spaced apart from the third and fourth connection members.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
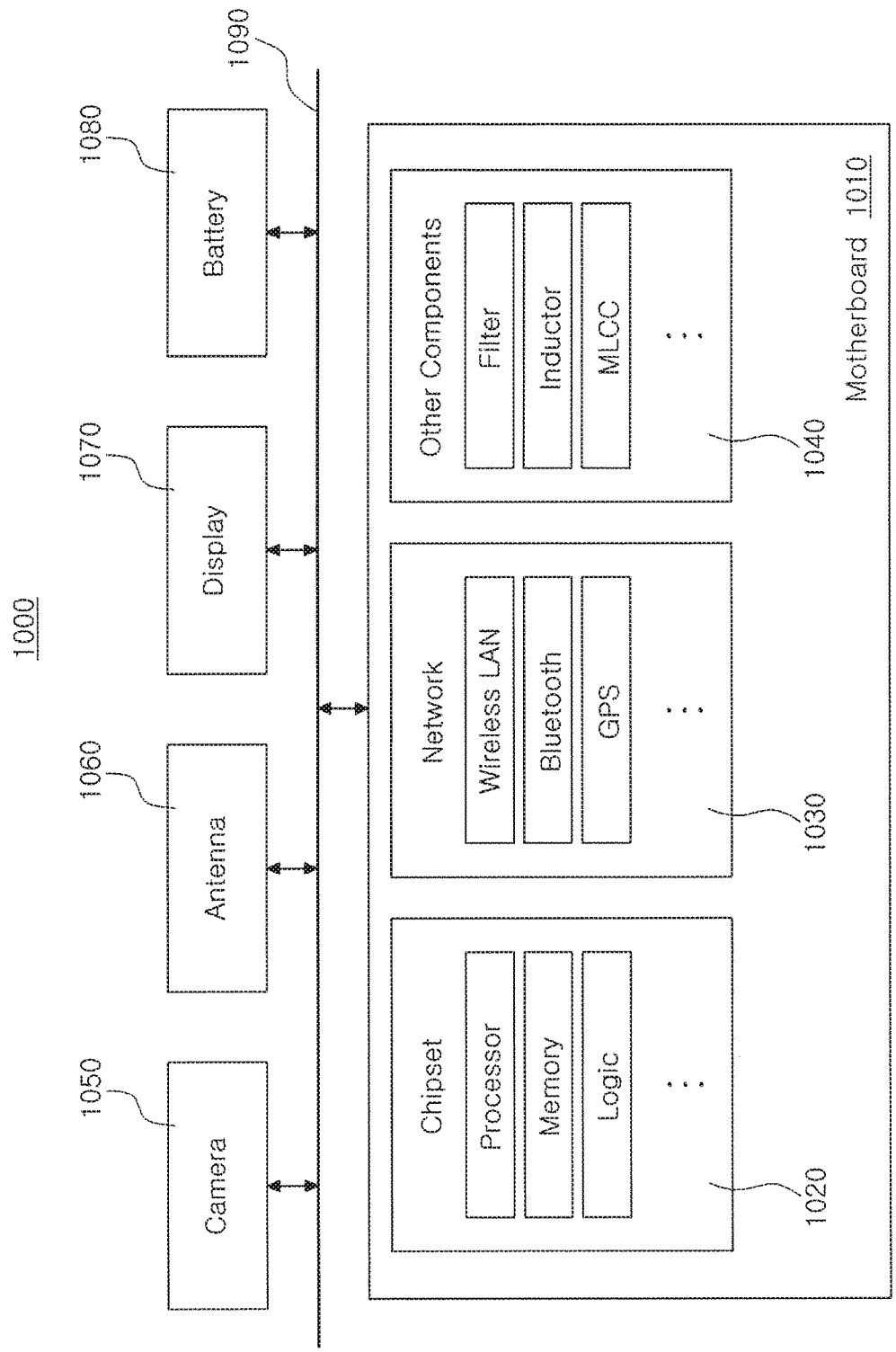
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
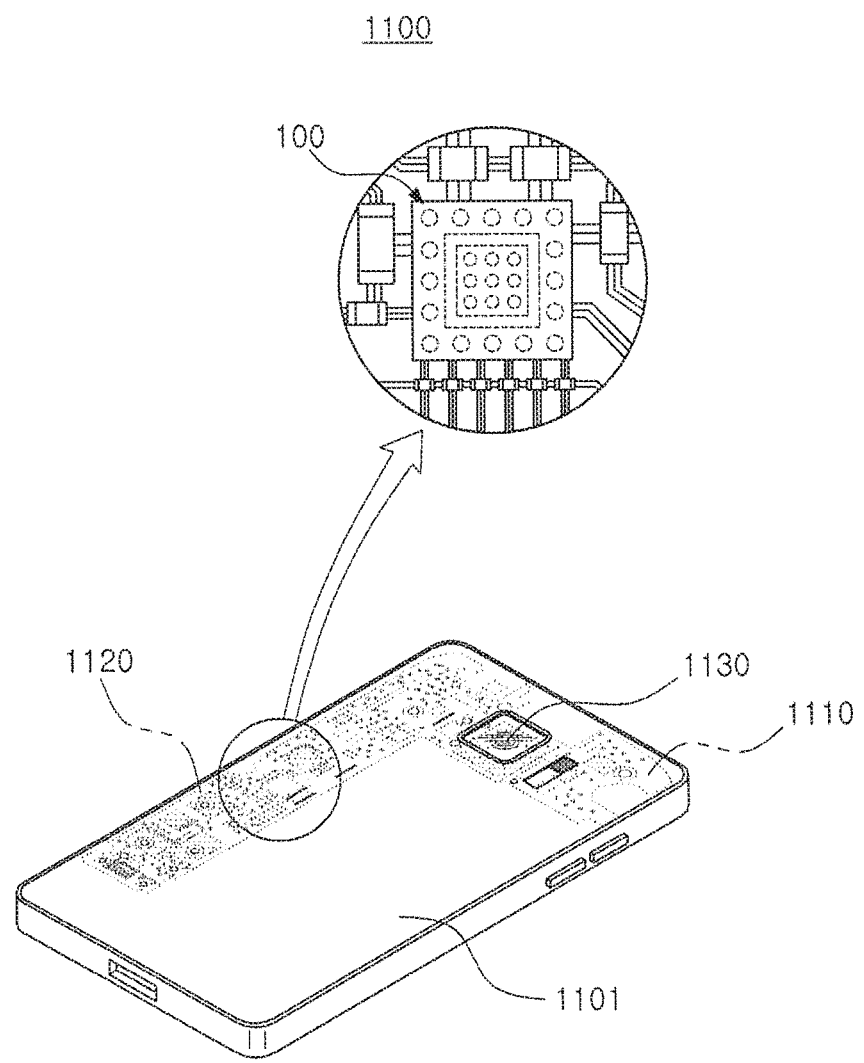
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mother board 1110 may be accommodated in a body 1101 of a smartphone 1100, and various electronic components 1120 may be physically or electrically connected to the mother board 1110. In addition, other components that may or may not be physically or electrically connected to the mother board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required. A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
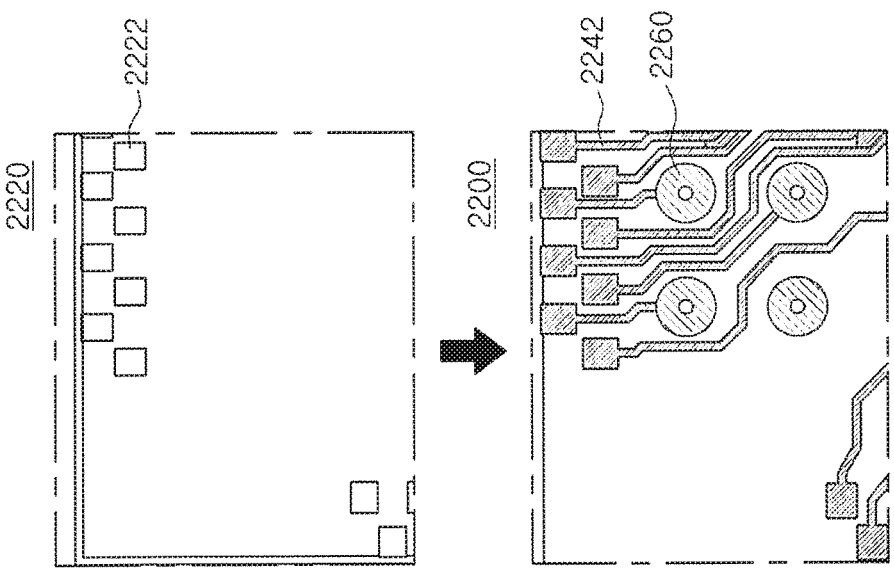
FIGS. 3A and 3B are schematic cross-sectional views illustrating states of a fan-in semiconductor package before and after being packaged.
Figure 3A:
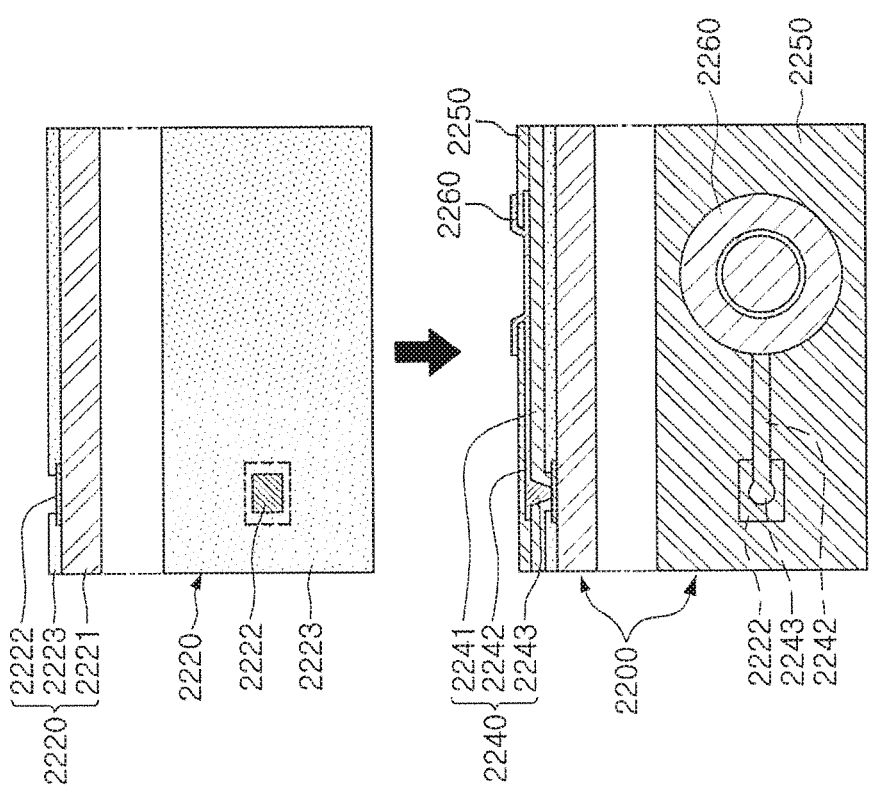

FIGS. 3A and 3B are schematic cross-sectional views illustrating states of a fan-in semiconductor package before and after being packaged.

Figure 4:
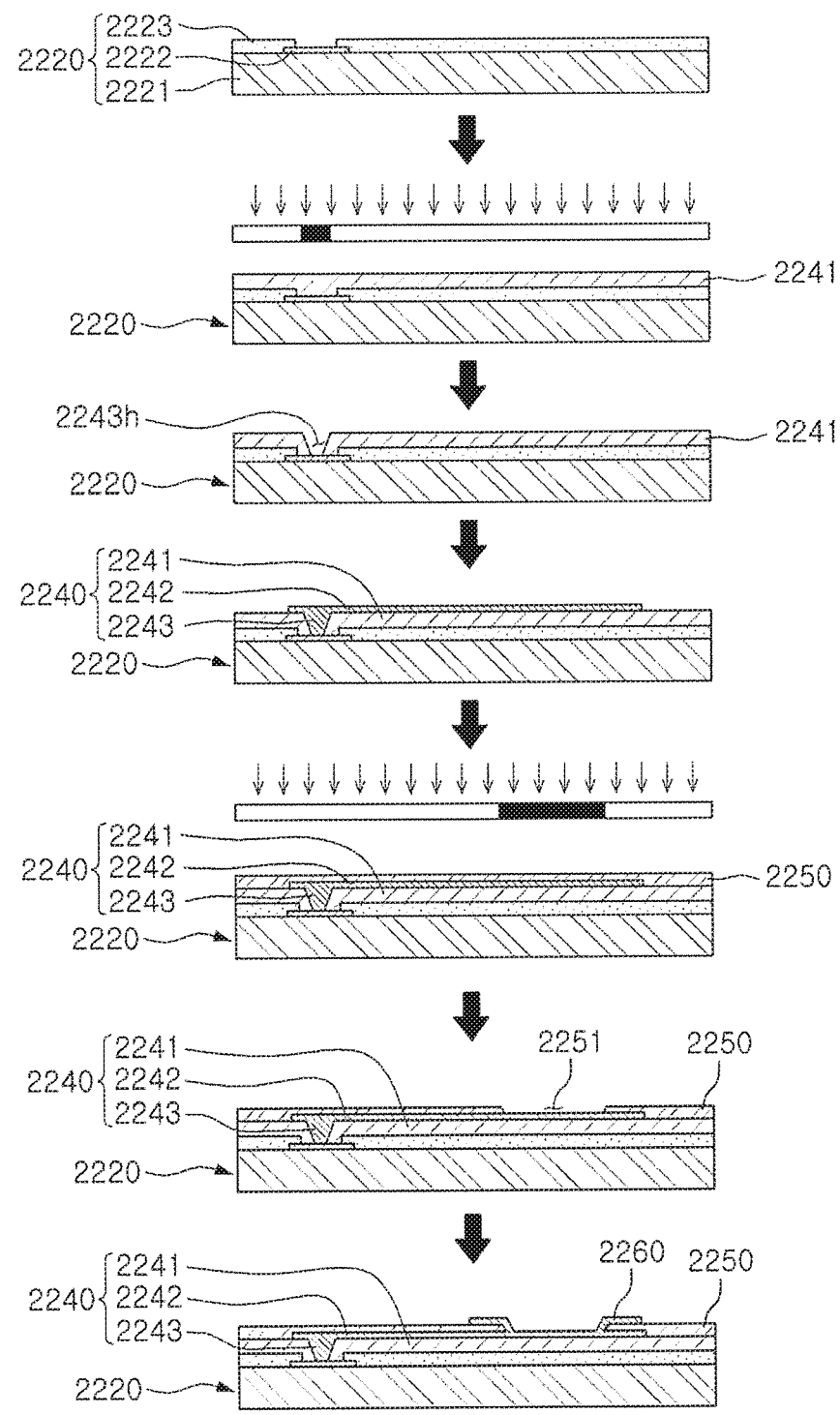
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
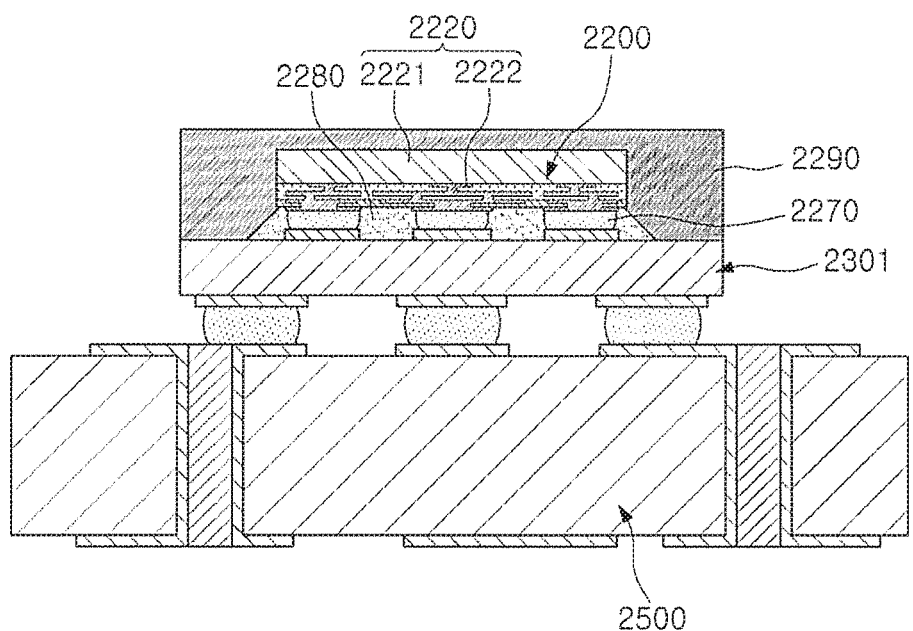
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
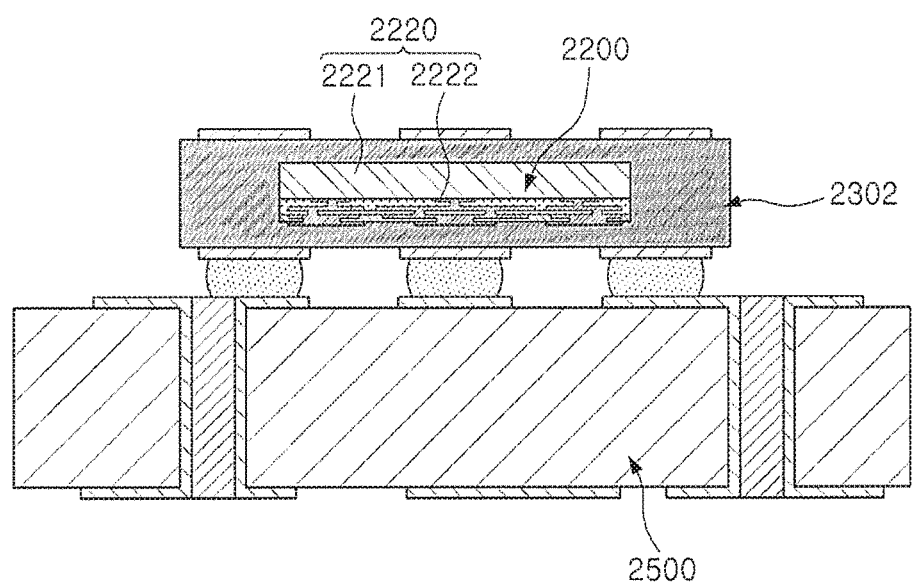
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
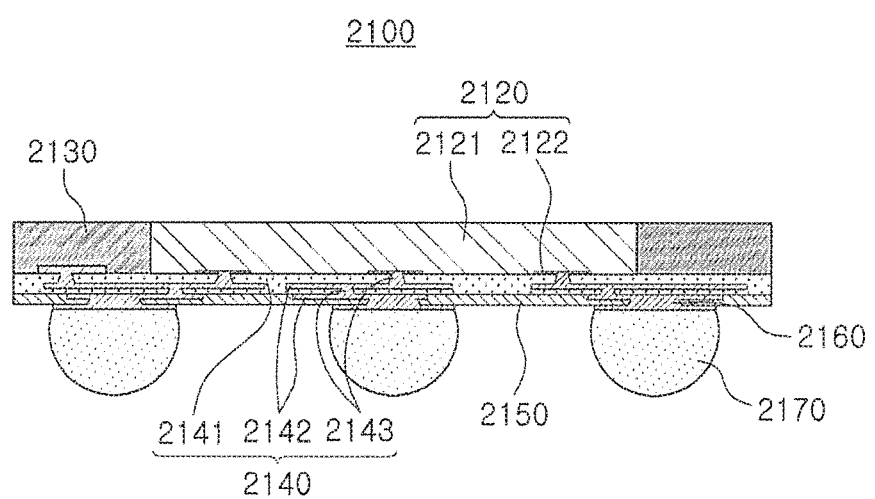
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
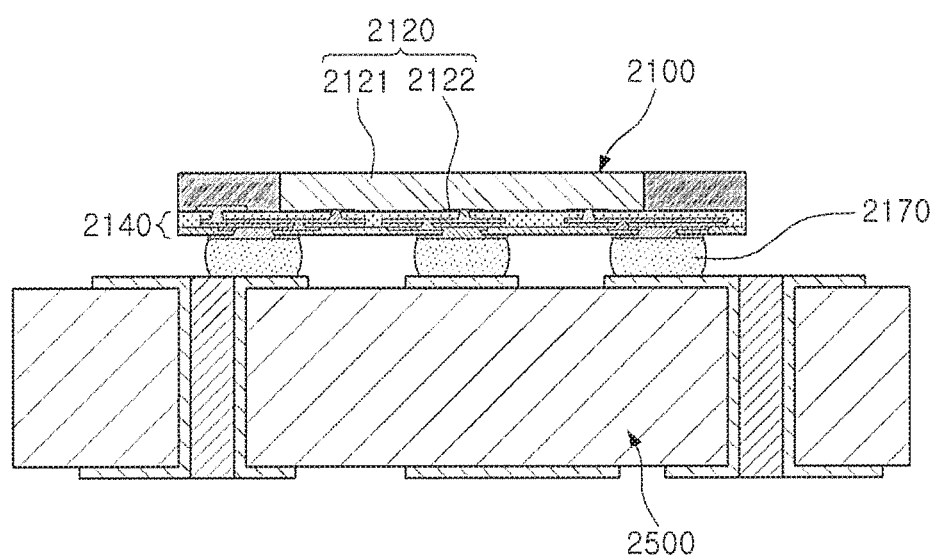
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Semiconductor Device

Figure 9:
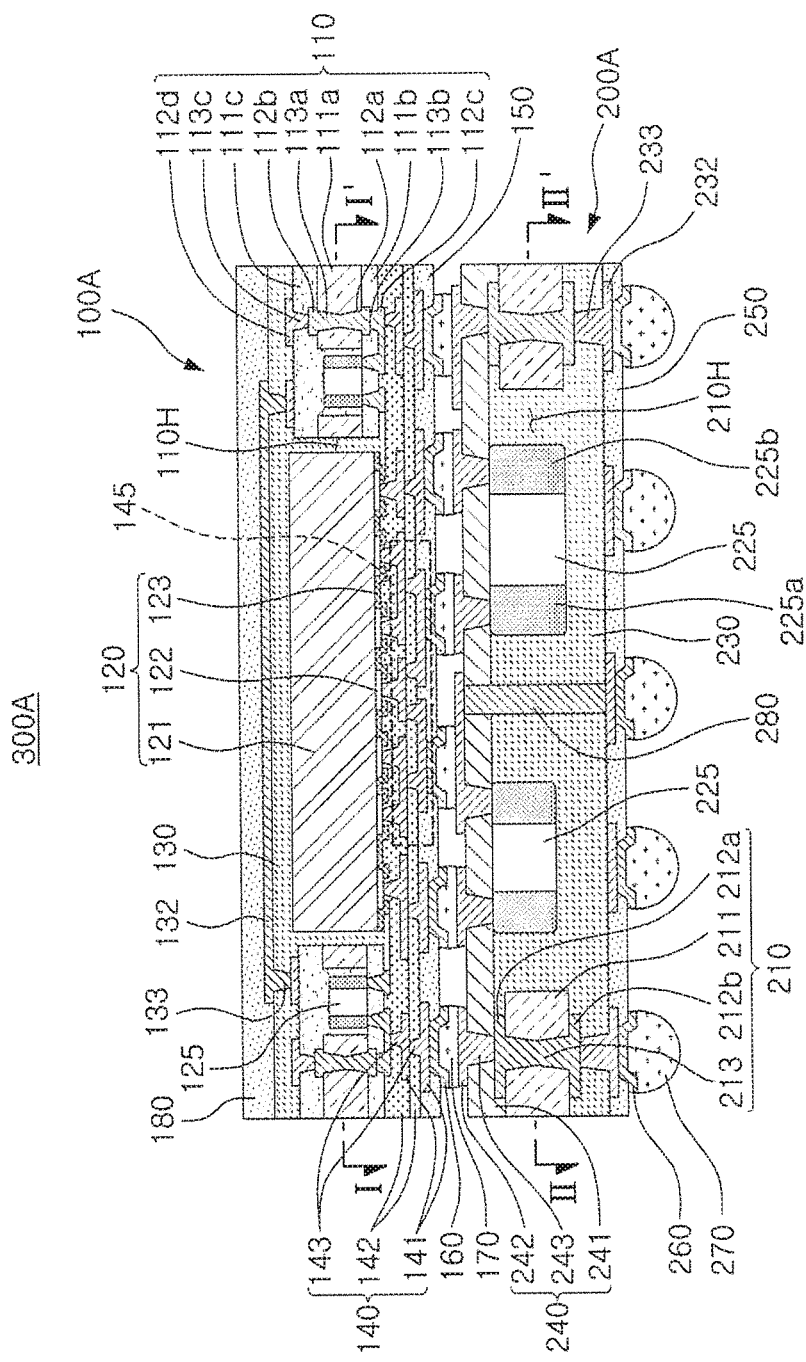
FIG. 9 is a schematic cross-sectional view illustrating an example of a fan-out semiconductor device.

FIG. 9 is a schematic cross-sectional view illustrating an example of a fan-out semiconductor device.

Figure 10:
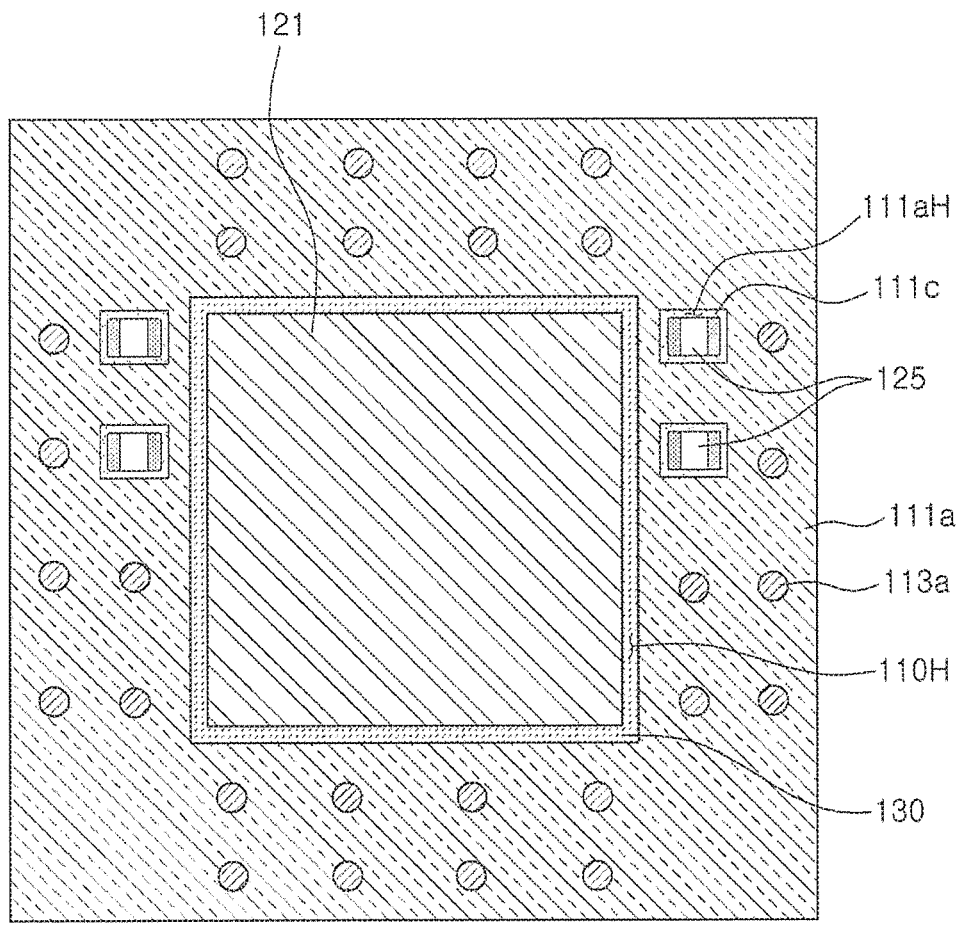
FIG. 10 is a schematic plan view taken along line I-I' of the fan-out semiconductor device of FIG. 9.

FIG. 10 is a schematic plan view taken along line I-I' of the fan-out semiconductor device of FIG. 9.

Figure 11:
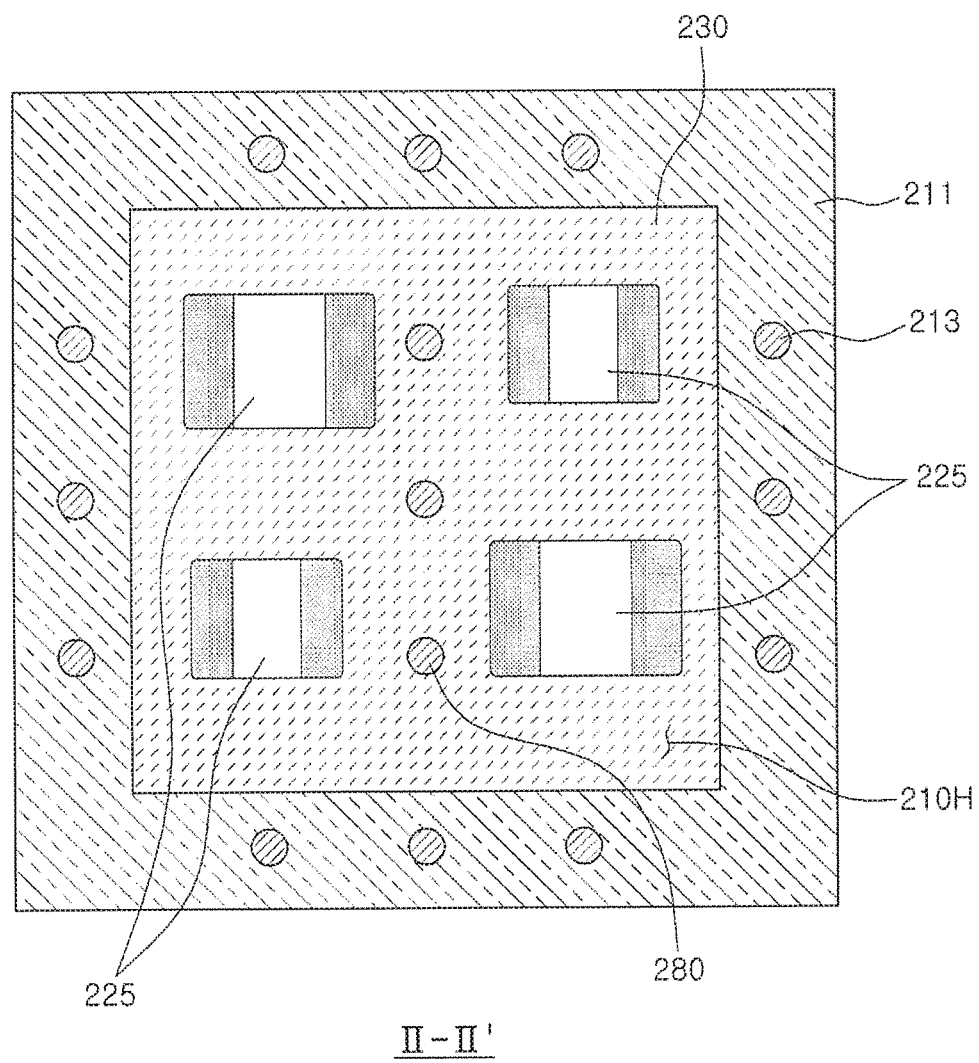
FIG. 11 is a schematic plan view taken along line II-II' of the fan-out semiconductor device of FIG. 9.

FIG. 11 is a schematic plan view taken along line II-II' of the fan-out semiconductor device of FIG. 9.

Referring to the drawings, a fan-out semiconductor device 300A according to an exemplary embodiment in the present disclosure may include a fan-out semiconductor package 100A and a fan-out component package 200A. Here, a fan-out form is decided in relation to a semiconductor chip 120 of the fan-out semiconductor package 100A. Referring to the drawings, the fan-out semiconductor package 100A may include a first connection member 110 having a first through-hole 110H, a semiconductor chip 120 disposed in the first through-hole 110H and having an active surface having connection pads 122 disposed thereon and an inactive surface opposing the active surface, a first encapsulant 130 encapsulating at least portions of the semiconductor chip 120, and a second connection member 140 disposed on the first connection member 110 and the active surface of the semiconductor chip 120. The first and second connection members 110 and 140 may include, respectively, redistribution layers 112a to 112d and redistribution layers 142 electrically connected to the connection pads 122. The fan-out component package 200A may include a third connection member 210 having a second through-hole 210H, first passive components 225 disposed in the second through-hole 210H, a second encapsulant 230 encapsulating at least portions of the first passive components 225, and a fourth connection member 240 disposed on the third connection member 210 and the first passive components 225. The third and fourth connection members 210 and 240 may include, respectively, redistribution layers 212a and 212b and a redistribution layer 242 electrically connected to the connection pads 122. The fan-out semiconductor package 100A may be stacked on the fan-out component package 200A so that the second connection member 140 faces the fourth connection member 240, and may be electrically connected to the fan-out component package 200A through first connection terminals 170.

Generally, a semiconductor chip and a passive component are mounted on a main board or a sub-board of an information technology (IT) device such as a mobile device, or the like, to form a chip-on-board (COB) structure. However, in this case, there is a limitation in reducing an interval between components on the board, and the semiconductor chip and the passive component are disposed in parallel with each other, and an electrical path between the semiconductor chip and the passive component may thus be significant. In addition, an interposer used as the sub-board is expensive. In order to solve these problems, it may be considered to package the semiconductor chip in a fan-out form and mount the passive component beneath such a fan-out semiconductor package using surface mounting technology (SMT). However, in this case, a region in which connection terminals such as solder balls, or the like, are disposed is reduced, such that there is a problem in utilizing a plurality of I/O pads, and a problem may occur in a yield since a package itself is discarded when a defect occurs in a process of mounting the passive component.

On the other hand, the fan-out semiconductor device 300A according to the exemplary embodiment may have a package-on-package (POP) structure. In this case, the fan-out semiconductor package 100A, a fan-out semiconductor package in which a semiconductor chip is packaged, may be introduced as an upper package, and the fan-out component package 200A, a fan-out component package in which a passive component is packaged, may be introduced as a lower package. That is, the semiconductor chip 120 and the first passive components 225 may be introduced in a three-dimensional (3D) structure into one device, such that miniaturization (a reduction in an X-Y area) of the device is possible. In addition, since the first passive components 225 of the fan-out component package 200A are disposed beneath the semiconductor chip 120 of the fan-out semiconductor package 100A to at least partially overlap the semiconductor chip 120 when viewed from a stacking direction, signal transfer paths between the semiconductor chip 120 and the first passive components 225 may be significantly reduced. In addition, a plurality of connection pads 122 of the semiconductor chip 120 may be redistributed by the first and second connection members 110 and 140 of the fan-out semiconductor package 100A, be connected to and be again redistributed by the third and fourth connection members 210 and 240 of the fan-out component package 200A through the first connection terminals 170, and be then leaded through second connection terminals 270 formed without having a spatial limitation over fan-in and fan-out regions at a lower portion of the fan-out component package 200A. Therefore, there is no problem in utilizing a plurality of I/O pads. In addition, since the fan-out semiconductor package 100A and the fan-out component package 200A may be separately manufactured and be then stacked, a defect occurring in a process of manufacturing the fan-out component package 200A may not have an influence on a yield of the fan-out semiconductor package 100A.

Meanwhile, in the fan-out semiconductor device 300A according to the exemplary embodiment, second passive components 125 may be disposed in the first connection member 110 of the fan-out semiconductor package 100A. The second passive components 125 may be electrically connected to the connection pads 122 of the semiconductor chip 120 through the redistribution layers 112a to 112d of the first connection member 110 and the redistribution layers 142 of the second connection member 140. The second passive components 125 may be small passive components having a thickness relatively smaller than that of the first passive components 225. That is, the second passive components 125 having the relatively reduced thickness may be embedded in the first connection member 110, and the first passive components 225 having the relatively great thickness may be introduced into the fan-out component package 200A to thus significantly increase space utilization and avoid a problem such as a process defect, or the like, occurring when the first passive components 225 and the second passive components 125 are encapsulated together with each other.

The respective components included in the fan-out semiconductor device 300A according to the exemplary embodiment will hereinafter be described in more detail.

First, the fan-out semiconductor package 100A may include the first connection member 110 having the first through-hole 110H, the semiconductor chip 120 disposed in the first through-hole 110H and having the active surface having the connection pads 122 disposed thereon and the inactive surface opposing the active surface, the first encapsulant 130 encapsulating at least portions of the semiconductor chip 120, and the second connection member 140 disposed on the first connection member 110 and the active surface of the semiconductor chip 120. In addition, the fan-out semiconductor package 100A may include a metal layer 132, vias 133, a passivation layer 150, an underbump metal layer 160, and/or the first connection terminals 170.

The first connection member 110 may include the redistribution layers 112a to 112d redistributing the connection pads 122 of the semiconductor chip 120 to thus reduce the number of layers of the second connection member 140. If necessary, the first connection member 110 may further improve rigidity of the fan-out semiconductor package 100A depending on certain materials, and serve to secure uniformity of a thickness of the first encapsulant 130. The fan-out semiconductor package 100A may be applied to the POP structure by the first connection member 110. The first connection member 110 may have the first through-hole 110H. The semiconductor chip 120 may be disposed in the first through-hole 110H to be spaced apart from the first connection member 110 by a predetermined distance. Side surfaces of the semiconductor chip 120 may be surrounded by the first connection member 110. However, such a form is only an example and may be variously modified into other forms.

The first connection member 110 may include a first insulating layer 11a having third through-holes 111aH in which the second passive components 125 are disposed, a first redistribution layer 112a and a second redistribution layer 112b disposed on opposite surfaces of the first insulating layer 111a, respectively, a second insulating layer 111b disposed on the first insulating layer 11a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first and second redistribution layers 112a and 112b may be electrically connected to each other through first vias 113a penetrating through the first insulating layer 11a. The first and third redistribution layers 112a and 112c may be electrically connected to each other through second vias 113b penetrating through the second insulating layer 111b, and the second and fourth redistribution layers 112b and 112d may be connected to each other through third vias 113c penetrating through the third insulating layer 111c. The second insulating layer 111b may fill at least portions of the third through-holes 111aH, and encapsulate at least portions of the second passive components 125. The number of each of insulating layers and redistribution layers constituting the first connection member 110 may also be greater or smaller than that described above.

The first insulating layer 111a may have a thickness greater than that of the second insulating layer 111b. The first insulating layer 11a may have a relatively great thickness in order to maintain rigidity, and the second insulating layer 111b, which is introduced in order to form a larger number of redistribution layers, may have a relatively reduced thickness. Similarly, a thickness of the first insulating layer 11a may be greater than that of the third insulating layer 111c covering the first insulating layer 11a. Similarly, the first via 113a penetrating through the first insulating layer 111a may have a height higher than those of the second and third vias 113b and 113c, and may have a diameter relatively greater than those of the second and third vias 113b and 113c unlike illustrated in the drawings.

The first and second redistribution layers 112a and 112b formed in the first connection member 110 may be disposed on a level between the active surface and the inactive surface of the semiconductor chip 120. The reason is that the first connection member 110 may be formed at a thickness corresponding to that of the semiconductor chip 120. Thicknesses of the redistribution layers 112a to 112d of the first connection member 110 may be greater than those of the redistribution layers 142 of the second connection member 140. Since the first connection member 110 may have a thickness equal to or greater than that of the semiconductor chip 120, the redistribution layers 112a to 112d may also be formed to have large sizes. On the other hand, the redistribution layers 142 of the second connection member 140 may be formed at relatively small sizes for thinness.

A material of each of the insulating layers 111a to 111c is not particularly limited. For example, an insulating material may be used as the material of each of the insulating layers 111a to 111c. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, Ajinomoto Build up Film (ABF), FR-4, Bismaleimide Triazine (BT), or the like. The insulating layers 111a to 111c may be formed of the same insulating material or different insulating materials, and when the insulating layers 111a to 111c are formed of the same insulating material, boundaries between the insulating layers 111a to 111c after the insulating material is hardened may not be apparent.

The redistribution layers 112a to 112d may serve to redistribute connection pads 122 of the semiconductor chip 120. In addition, the redistribution layers 112a to 112d may also serve to redistribute the passive component 125 and 225. A material of each of the redistribution layers 112a to 112d may be a conductive material such as copper (Cu), aluminum (Al), silver (Ag), tin (Sn), gold (Au), nickel (Ni), lead (Pb), titanium (Ti), or alloys thereof. The redistribution layers 112a to 112d may perform various functions depending on designs of their corresponding layers. For example, the redistribution layers 112a to 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a to 112d may include via pads, and the like.

The vias 113a to 113c may electrically connect the redistribution layers formed on different layers to each other, resulting in an electrical path in the first connection member 110. The second passive components 125 may be electrically connected to the redistribution layers 142 of the second connection member 140 through the vias 113a to 113c. A material of each of the vias 113a to 113c may be a conductive material. Each of the vias 113a to 113c may be completely filled with the conductive material, or the conductive material may also be formed along a wall of each of via holes. Each of the vias 113a to 113c may have a cylindrical shape, a sandglass shape, a tapered shape, and the like, depending on thicknesses or materials of the insulating layers.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a microcontroller, etc., a memory chip such as a volatile memory (for example, a DRAM), a non-volatile memory (for example, a ROM), a flash memory, etc., or a logic chip such as an analog-to-digital converter, an application-specific IC (ASIC), etc. In addition, the IC may also be an IC for managing power, such as a power management IC (PMIC), etc. A larger number of semiconductor chips than that illustrated in the drawings may be embedded in the fan-out semiconductor package 100A.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the first encapsulant 130 through the passivation layer 123. An insulating layer (not illustrated), and the like, may be further disposed in other required positions.

The second passive components 125 may be capacitors such as multilayer ceramic capacitors (MLCCs), low inductance chip capacitors (LICCs), or the like, respectively. However, the second passive components 125 are not limited thereto, but may be inductors, or the like. The number of second passive components 125 may be greater or smaller than that illustrated in the drawings, and the second passive components 125 may be the same or different components. Meanwhile, since the second passive components 125 are disposed in the third through-holes 111aH of the first insulating layer 111a, the second passive components 125 may be more stably mounted.

The first encapsulant 130 may encapsulate at least portions of the first connection member 110, the semiconductor chip 120, and the like, and protect the first connection member 110, the semiconductor chip 120, and the like. An encapsulation form of the first encapsulant 130 is not particularly limited, but may be a form in which the first encapsulant 130 surrounds at least portions of the first connection member 110, the semiconductor chip 120, and the like. For example, the first encapsulant 130 may cover the first connection member 110 and the inactive surface of the semiconductor chip 120, and fill at least portions of spaces between walls of the first through-hole 110H and the side surfaces of the semiconductor chip 120. The first encapsulant 130 may fill the first through-hole 110H to thus serve as an adhesive for fixing the semiconductor chip 120 depending on certain materials. In addition, the first encapsulant 130 may reduce buckling of the semiconductor chip 120.

The first encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which an insulating resin such as a thermosetting resin or a thermoplastic resin is impregnated in an inorganic filler and a core material such as a glass fiber (or a glass cloth or a glass fabric) may also be used as the insulating material, in order to control the warpage.

The metal layer 132 may be disposed on the first encapsulant 130, if necessary. The metal layer 132 may cover an upper region of the inactive surface of the semiconductor chip 120. The metal layer 132 may be electrically connected to the ground pattern of the fourth redistribution layer 112d of the first connection member 110 through the vias 133 penetrating through the first encapsulant 130. That is, the metal layer 132 may also be utilized as the ground pattern. The metal layer 132 may cover the upper region of the inactive surface of the semiconductor chip 120 to have an electromagnetic wave blocking effect and have a heat dissipation effect. A metal layer (not illustrated) may be further formed on the walls of the first through-hole 110H, and be connected to the metal layer 132, if necessary. In this case, the electromagnetic wave blocking effect and the heat dissipation effect may be more excellent. A material of the metal layer 132 is not particularly limited, but may be copper (Cu), aluminum (Al), silver (Ag), tin (Sn), gold (Au), nickel (Ni), lead (Pb), titanium (Ti), or alloys thereof. Meanwhile, when the metal layer 132 is patterned, the metal layer 132 may also be utilized as a rear redistribution layer.

The second connection member 140 may redistribute the passive components 125 and 225 and/or the connection pads 122 of the semiconductor chip 120. Several ten to several hundred connection pads 122 of the semiconductor chip 120 having various functions may be redistributed by the second connection member 140, and may be physically or electrically connected to an external source at least through the first connection terminals 170 depending on the functions. In addition, the second passive components 125 embedded in the first connection member 110 may be electrically connected to the semiconductor chip 120 through the second connection member 140. The second connection member 140 may include insulating layers 141, the redistribution layers 142 disposed on the insulating layers 141, and vias 143 penetrating through the insulating layers 141 and connecting the redistribution layers 142 to each other. The second connection member 140 may be formed of a single layer, or may be formed of a plurality of layers of which the number is greater than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the passive components 125 and 225 and/or the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 122, or the like, formed on different layers to each other, resulting in an electrical path in the second connection member 140. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have all of the shapes known in the related art, such as a tapered shape, a cylindrical shape, and the like.

A heat dissipation part 145 may be formed in the second connection member 140. The heat dissipation part 145 may be connected to the active surface of the semiconductor chip 120, and may dissipate heat generated from the semiconductor chip 120 downwardly. The heat dissipation part 145 may include heat dissipation vias. The heat dissipation vias may be electrically connected to the ground patterns in the fan-out semiconductor package 100A. For example, the semiconductor chip 120 may include connection pads for a ground and connection pads for a signal as the connection pads 122. Here, the connection pads for a ground may be electrically connected to the heat dissipation vias of the heat dissipation part 145, and the connection pads for a signal may be electrically connected to signal vias in the second connection member 140 except for the heat dissipation part 145. Meanwhile, the first passive components 225 may include first electrodes 225a electrically connected to the connection pads for a ground through the heat dissipation vias and second electrodes 225b electrically connected to the connection pads for a signal through the signal vias. The connection pads for a ground may be disposed on a central portion of the active surface of the semiconductor chip and at least partially overlap the heat dissipation vias when viewed from the stacking direction, and the connection pads for a signal may be disposed on an outer side of the active surface of the semiconductor chip and at least partially overlap the signal vias when viewed in the stacking direction. The semiconductor chip 120 may be the PMIC and the first passive component 225 may be the capacitor, but the semiconductor chip 120 and the first passive component 225 are not necessarily limited thereto.

The first passivation layer 150 may protect the second connection member 140 from external physical or chemical damage. The first passivation layer 150 may have openings exposing at least portions of the redistribution layer 142 of the second connection member 140. The number of openings formed in the first passivation layer 150 may be several tens to several thousands. The first passivation layer 150 may include an insulating resin and an inorganic filler, but may not include a glass fiber. For example, the first passivation layer 150 may be formed of ABF, but is not limited thereto.

The first underbump metal layer 160 may improve connection reliability of the first connection terminals 170. The first underbump metal layer 160 may be connected to the redistribution layer 142 of the second connection member 140 opened through the openings of the first passivation layer 150. The first underbump metal layer 160 may be formed in the openings of the first passivation layer 150 by the known metallization method using the known conductive material such as a metal, but is not limited thereto.

The first connection terminals 170 may be configured to electrically connect the fan-out semiconductor package 100A to the fan-out component package 200A, or the like. Each of the first connection terminals 170 may be formed of a conductive material, for example, a solder, or the like. However, this is only an example, and a material of each of the first connection terminals 170 is not particularly limited thereto. The first connection terminal 170 may be a land, a ball, a pin, or the like. The first connection terminal 170 may be formed of multiple layers or a single layer. When the first connection terminals 170 are formed as a multilayer structure, the first connection terminals 170 may include a copper (Cu) pillar and a solder. When the first connection terminals 170 are formed as a single layer structure, the first connection terminals 170 may include a tin-silver solder or copper (Cu). However, this is only an example, and the first connection terminals 170 are not limited thereto.

The number, an interval, a disposition, or the like, of first connection terminals 170 are not particularly limited, but may be sufficiently modified by a person skilled in the art depending on design particulars. For example, the first connection terminals 170 may be provided in an amount of several tens to several thousands according to the number of connection pads 122, or may be provided in an amount of several tens to several thousands or more or several tens to several thousands or less. The first connection terminals 170 may cover side surfaces of the first underbump metal layer 160 extending onto one surface of the first passivation layer 150, and connection reliability may be more excellent.

At least one of the first connection terminals 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness. That is, the fan-out semiconductor package 100A may be a fan-out semiconductor package.

A cover layer 180 covering the metal layer 132 may be disposed on the first encapsulant 130, if necessary. The cover layer 180 may protect the metal layer 132, or the like, from external physical or chemical damage. The cover layer 180 may include an insulating resin and an inorganic filler, but may not include a glass fiber. For example, the cover layer 180 may be formed of ABF, but is not limited thereto.

Next, the fan-out component package 200A may include the third connection member 210 having the second through-hole 210H, the first passive components 225 disposed in the second through-hole 210H, the second encapsulant 230 encapsulating at least portions of the first passive components 225, and the fourth connection member 240 disposed on the third connection member 210 and the first passive components 225. In addition, the fan-out component package 200A may include a rear redistribution layer 232, rear vias 233, a second passivation layer 250, a second underbump metal layer 260, the second connection terminals 270, and/or a through-wiring 280.

The third connection member 210 may include the redistribution layers 212a and 212b redistributing the passive components 125 and 225 and/or the connection pads 122 of the semiconductor chip 120 to thus reduce the number of layers of the fourth connection member 240. If necessary, the third connection member 210 may further improve rigidity of the fan-out component package 200A depending on certain materials, and serve to secure uniformity of a thickness of the second encapsulant 230. The fan-out component package 200A may be applied to the POP structure by the third connection member 210. The third connection member 210 may have the second through-hole 210H. One or more first passive components 225 may be disposed in the second through-hole 210H to be spaced apart from the third connection member 210 by a predetermined distance. Side surfaces of the first passive components 225 may be surrounded by the third connection member 210. However, such a form is only an example and may be variously modified into other forms. The third connection member 210 may include first and second redistribution layers 212a and 212b formed on opposite surfaces of an insulating layer 211, respectively. The first and second redistribution layers 212a and 212b may be electrically connected to each other through vias 213 penetrating through the insulating layer 211. The number of each of insulating layers and redistribution layers constituting the third connection member 210 may also be greater or smaller than that described above.

A material of the insulating layer 211 is not particularly limited. For example, an insulating material may be used as the material of the insulating layer 211. In this case, the insulating material may be a thermosetting resin such as an epoxy resin, a thermoplastic resin such as a polyimide resin, a resin in which the thermosetting resin or the thermoplastic resin is impregnated in an inorganic filler or a core material such as a glass fiber (or a glass cloth or a glass fabric), for example, prepreg, ABF, FR-4, BT, or the like.

The redistribution layers 212a and 212b may serve to redistribute the passive components 125 and 225 and/or the connection pads 122 of the semiconductor chip 120. A material of each of the redistribution layers 212a and 212b may be a conductive material such as copper (Cu), aluminum (Al), silver (Ag), tin (Sn), gold (Au), nickel (Ni), lead (Pb), titanium (Ti), or alloys thereof. The redistribution layers 212a and 212b may perform various functions depending on designs of their corresponding layers. For example, the redistribution layers 212a and 212b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 212a and 212b may include via pads, and the like.

The vias 213 may electrically connect the redistribution layers formed on different layers to each other, resulting in an electrical path in the third connection member 210. A material of each of the vias 213 may be a conductive material. Each of the vias 213 may be completely filled with the conductive material, or the conductive material may be formed along a wall of each of via holes. Each of the vias 213 may have a cylindrical shape, a sandglass shape, a tapered shape, and the like, depending on thicknesses or materials of the insulating layers.

The first passive components 225 may be capacitors such as multilayer ceramic capacitors (MLCCs), low inductance chip capacitors (LICCs), or the like, respectively. However, the first passive components 225 are not limited thereto, but may be inductors, or the like. The number of first passive components 225 may be greater or smaller than that illustrated in the drawings, and the first passive components 225 may be the same or different components. The first passive components 225 may have the first electrodes 225a and the second electrodes 225b as described above, respectively. Meanwhile, since the first passive components 225 are disposed in the second through-hole 210H of the third connection member 210 and are encapsulated with the second encapsulant 230, the first passive components 225 may be more stably mounted. The first passive components 225 may have a thickness relatively greater than that of the second passive components 125, and may have a size relatively greater than that of the second passive components 125.

The second encapsulant 230 may encapsulate at least portions of the third connection member 210, the first passive components 225, and the like, and protect the third connection member 210, the first passive components 225, and the like. An encapsulation form of the second encapsulant 230 is not particularly limited, but may be a form in which the second encapsulant 230 surrounds at least portions of the third connection member 210, the first passive components 225, and the like. For example, the second encapsulant 230 may cover the third connection member 210 and the first passive components 225, and fill at least portions of spaces between walls of the second through-hole 210H and the side surfaces of the first passive components 225. The second encapsulant 230 may fill the second through-hole 110H to thus serve as an adhesive for fixing the first passive components 225 depending on certain materials. In addition, the second encapsulant 230 may reduce buckling of the first passive components 225.

The second encapsulant 230 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an epoxy molding compound (EMC), or the like, may also be used. Alternatively, a material in which an insulating resin such as a thermosetting resin or a thermoplastic resin is impregnated in an inorganic filler and a core material such as a glass fiber (or a glass cloth or a glass fabric) may also be used as the insulating material, in order to control the warpage.

The rear redistribution layer 232 may serve to provide an electrical path in the fan-out semiconductor device 300A to the second connection terminals 270 for connection to an external source. The rear redistribution layer 232 may be formed in both of the fan-in region and the fan-out region in relation to dispositions of the semiconductor chip 120 and/or the first passive components 225. The rear redistribution layer 232 may also be formed of a conductive material such as copper (Cu), aluminum (Al), silver (Ag), tin (Sn), gold (Au), nickel (Ni), lead (Pb), titanium (Ti), or alloys thereof. The rear redistribution layer 232 may perform various functions depending on a design of its corresponding layer. For example, the rear redistribution layer 232 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the rear redistribution layers 232 may include via pads, connection terminal pads, and the like.

The rear vias 233 may penetrate through the second encapsulant 230, and electrically connect the second redistribution layer 212b of the third connection member 210 and the rear redistribution layer 232 to each other. A material of each of the rear vias 233 may be a conductive material such as copper (Cu), aluminum (Al), silver (Ag), tin (Sn), gold (Au), nickel (Ni), lead (Pb), titanium (Ti), or alloys thereof. Each of the rear vias 233 may be completely filled with a conductive material, or the conductive material may be formed along a wall of each of the vias. In addition, each of the rear vias 233 may have all of the shapes known in the related art, such as a tapered shape, a cylindrical shape, and the like.

The fourth connection member 240 may redistribute the passive components 125 and 225 and/or the connection pads 122 of the semiconductor chip 120. The fan-out semiconductor package 100A and the fan-out component package 200A may be easily electrically connected to each other through the second connection member 140 and the fourth connection member 240. The fourth connection member 240 may include an insulating layer 241, the redistribution layer 242 disposed on the insulating layer 241, and vias 243 penetrating through the insulating layer 241 and connecting the redistribution layers 212a and 242 to each other. The fourth connection member 240 may also be formed of a single layer, or may be formed of a plurality of layers of which the number is greater than that illustrated in the drawings.

A material of the insulating layer 241 may be an insulating material. In this case, a photosensitive insulating material such as a PID resin may also be used as the insulating material. That is, the insulating layer 241 may be a photosensitive insulating layer. When the insulating layer 241 has photosensitive properties, the insulating layer 241 may be formed to have a smaller thickness, and a fine pitch of the via 243 may be achieved more easily. The insulating layer 241 may be a photosensitive insulating layer including an insulating resin and an inorganic filler. When the insulating layers 241 are multiple layers, materials of the insulating layers 241 may be the same as each other, and may also be different from each other, if necessary. When the insulating layers 241 are the multiple layers, the insulating layers 241 may be integrated with each other depending on a process, such that a boundary therebetween may also not be apparent.

The redistribution layer 242 may serve to substantially redistribute the passive components 125 and 225 and/or the connection pads 122. A material of the redistribution layer 242 may be a conductive material such as copper (Cu), aluminum (Al), silver (Ag), tin (Sn), gold (Au), nickel (Ni), lead (Pb), titanium (Ti), or alloys thereof. The redistribution layer 242 may perform various functions depending on a design of its corresponding layer. For example, the redistribution layer 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 242 may include via pads, connection terminal pads, and the like.

The vias 243 may electrically connect the redistribution layers 212a and 242, or the like, formed on different layers to each other, resulting in an electrical path in the fourth connection member 240. A material of each of the vias 243 may be a conductive material such as copper (Cu), aluminum (Al), silver (Ag), tin (Sn), gold (Au), nickel (Ni), lead (Pb), titanium (Ti), or alloys thereof. Each of the vias 243 may be completely filled with the conductive material, or the conductive material may also be formed along a wall of each of the vias. In addition, each of the vias 243 may have all of the shapes known in the related art, such as a tapered shape, a cylindrical shape, and the like.

The second passivation layer 250 may protect the rear redistribution layer 232 from external physical or chemical damage. The second passivation layer 250 may have openings exposing at least portions of the rear redistribution layer 232. The number of openings formed in the second passivation layer 250 may be several tens to several thousands. The second passivation layer 250 may include an insulating resin and an inorganic filler, but may not include a glass fiber. For example, the second passivation layer 250 may be formed of ABF, but is not limited thereto.

The second underbump metal layer 260 may improve connection reliability of the second connection terminals 270. The second underbump metal layer 260 may be connected to the rear redistribution layer 232 opened through the openings of the second passivation layer 250. The second underbump metal layer 260 may be formed in the openings of the second passivation layer 250 by the known metallization method using the known conductive material such as a metal, but is not limited thereto.

The second connection terminals 270 may be configured to connect the fan-out semiconductor device 300A to an external component, for example, the main board of the electronic device. Each of the second connection terminals 270 may be formed of a conductive material, for example, a solder, or the like. However, this is only an example, and a material of each of the second connection terminals 270 is not particularly limited thereto. The second connection terminal 270 may be a land, a ball, a pin, or the like. The second connection terminal 270 may be formed as a multilayer or single layer structure. When the second connection terminals 270 are formed as a multilayer structure, the second connection terminals 270 may include a copper (Cu) pillar and a solder. When the second connection terminals 270 are formed as a single layer structure, the second connection terminals 270 may include a tin-silver solder or copper (Cu). However, this is only an example, and the second connection terminals 270 are not limited thereto.

The number, an interval, a disposition, or the like, of second connection terminals 270 are not particularly limited, but may be sufficiently modified by a person skilled in the art depending on design particulars. For example, the second connection terminals 270 may be provided in an amount of several tens to several thousands according to the number of connection pads 122, or may be provided in an amount of several tens to several thousands or more or several tens to several thousands or less. The second connection terminals 270 may cover side surfaces of the second underbump metal layer 260 extending onto one surface of the second passivation layer 250, and connection reliability may be more excellent.

The second connection terminals 270 may be disposed in both of the fan-in region and the fan-out region in relation to the semiconductor chip 120 and/or the first passive components 225. Therefore, even in a case in which the number of connection pads 122 of the semiconductor chip 120 is plural, a large number of I/O pads may be implemented. That is, the plurality of connection pads 122 of the semiconductor chip 120 may be redistributed by the first and second connection members 110 and 140 of the fan-out semiconductor package 100A, be connected to and be again redistributed by the third and fourth connection members 210 and 240 of the fan-out component package 200A through the first connection terminals 170, and be then leaded through second connection terminals 270 formed without having the spatial limitation over the fan-in and fan-out regions at the lower portion of the fan-out component package 200A. Therefore, there is no problem in utilizing the plurality of I/O pads.

The through-wiring 280 may penetrate through the second encapsulant 230 between a plurality of first passive components 225 and the fourth connection member 240, and electrically connect the redistribution layer 242 of the fourth connection member 240 and the rear redistribution layer 232 to each other. Various wiring designs may be enabled through the through-wiring 280. The through-wiring 280 may be formed of a conductive material such as copper (Cu), aluminum (Al), silver (Ag), tin (Sn), gold (Au), nickel (Ni), lead (Pb), titanium (Ti), or alloys thereof. The through-wiring 280 may also have all of the shapes known in the related art, such as a tapered shape, a cylindrical shape, and the like.

Although not illustrated in the drawings, a metal layer (not illustrated) may be formed on the walls of the second through-hole 210H of the third connection member 210, if necessary. The metal layer (not illustrated) may be electrically connected to ground patterns of the third connection member 210 and/or the fourth connection member 240.

The fan-out semiconductor device 300A according to the exemplary embodiment may be manufactured by separately manufacturing the fan-out semiconductor package 100A and the fan-out component package 200A and then stacking and connecting the fan-out semiconductor package 100A on and to the fan-out component package 200A using the first connection terminals 170.

Figure 12:
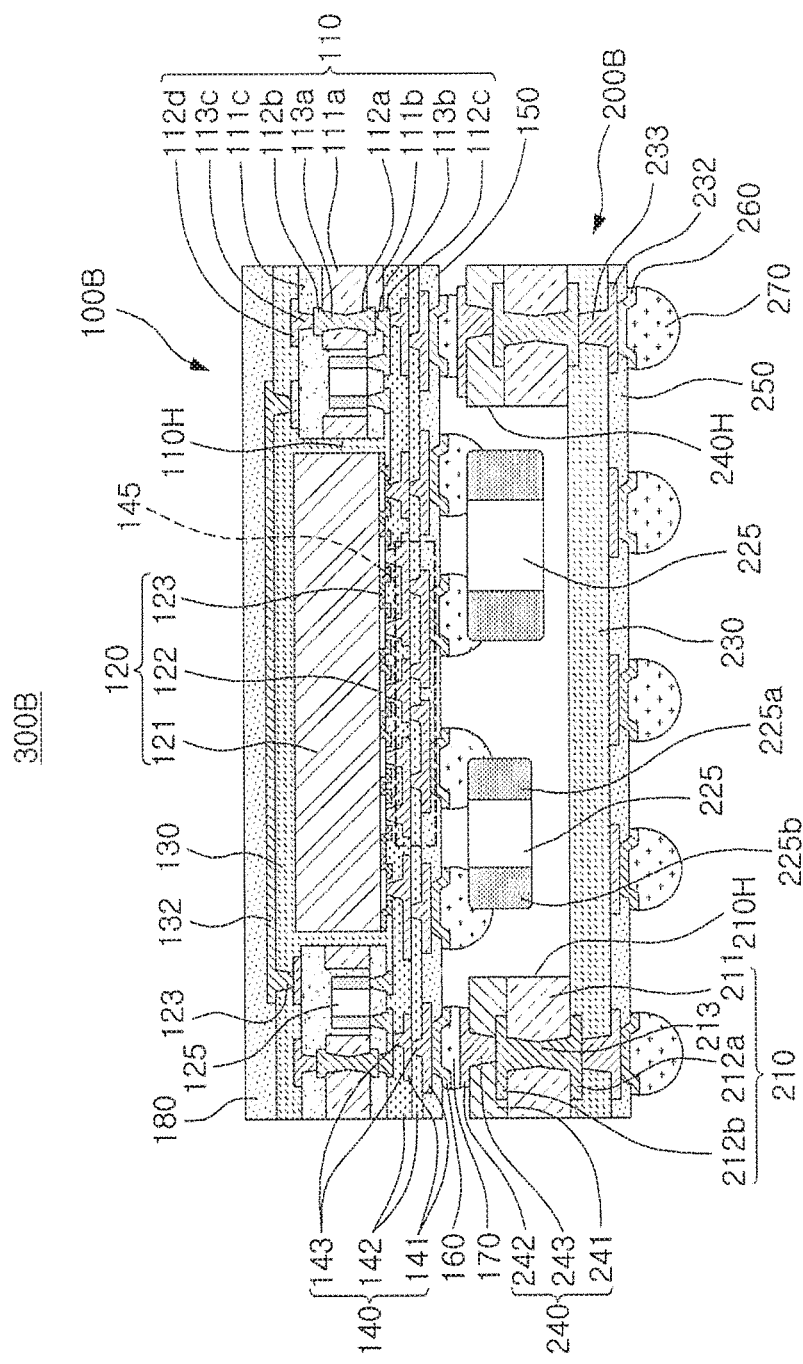
FIG. 12 is a schematic cross-sectional view illustrating another example of a fan-out semiconductor device.

FIG. 12 is a schematic cross-sectional view illustrating another example of a fan-out semiconductor device.

Referring to the drawing, a fan-out semiconductor device 300B according to another exemplary embodiment in the present disclosure may include a fan-out semiconductor package 100B and a fan-out substrate 200B. Here, a fan-out form is decided in relation to a semiconductor chip 120 of the fan-out semiconductor package 100B. The fan-out semiconductor package 100B may be substantially the same as that described in the fan-out semiconductor device 300A according to the exemplary embodiment described above. On the other hand, the fan-out substrate 200B may include a third connection member 210 having a second through-hole 210H, a second encapsulant 230 covering the third connection member 210 and blocking one side of the second through-hole 210H, and a fourth connection member 240 disposed on the third connection member 210 and having a fourth through-hole 240H extending from the other side of the second through-hole 210H. In this case, first passive components 225 are not encapsulated with the second encapsulant 230. That is, the first passive components 225 are disposed in the second through-hole 210H and the fourth through-hole 240H, but may be connected to only the second connection member 140 and may be physically spaced apart from the third connection member 210 and the fourth connection member 240. A space between the first passive components 225 and the third connection member 210 and/or the fourth connection member 240 may be empty. The first passive components 225 may be connected to the first underbump metal layer 160 of the fan-out semiconductor package 100B through the first connection terminals 170. The fan-out semiconductor device 300B according to another exemplary embodiment may be manufactured by separately manufacturing the fan-out semiconductor package 100B and the fan-out substrate 200B, attaching the first passive components 225 to a lower portion of the fan-out semiconductor package 100B using surface mounting technology (SMT), and then stacking and connecting the fan-out semiconductor package 100B on and to the fan-out substrate 200B using the first connection terminals 170. Other components overlap those described above, and a detailed description thereof is thus omitted.

As set forth above, according to the exemplary embodiments in the present disclosure, a semiconductor device capable of being miniaturized as compared to a chip-on-board (COB) according to the related art and having a large advantage in terms of a reduction in noise by significantly reducing a signal path between a semiconductor chip and a passive component may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor device comprising:
   a fan-out semiconductor package including:
      a first connection member including one or more insulating layers and having a first through-hole penetrating through the one or more insulating layer,
      a semiconductor chip disposed in the first through-hole and having an active surface having connection pads disposed thereon and an inactive surface opposing the active surface,
      a first encapsulant encapsulating at least portions of the semiconductor chip, and
      a second connection member disposed on the first connection member and the active surface of the semiconductor chip,
      the first and second connection members including, respectively, redistribution layers electrically connected to the connection pads; and
   a fan-out component package including:
      a third connection member including one or more insulating layers and a distribution layer, and having a second through-hole penetrating through the one or more insulating layers of the third connection member,
      a first passive component disposed in the second through-hole,
      a second encapsulant encapsulating at least portions of the first passive component, and
      a fourth connection member disposed on the third connection member and the first passive component, and including a redistribution layer,
      the third and fourth connection members including, respectively, redistribution layers electrically connected to the connection pads,
   wherein the fan-out semiconductor package is stacked on the fan-out component package so that the second connection member faces the fourth connection member,
   the first connection member, the second connection member, the fourth connection member, and the third connection member are stacked in an order of the first connection member, the second connection member, the fourth connection member, and the third connection member,
   the redistribution layer of the fourth connection member is disposed on an electrical path between the first passive component and one of the redistribution layer of the first connection member, the redistribution layer of the second connection member, the redistribution layer of the third connection member, or the connection pads of the semiconductor chip, and
   the connection pads are electrically connected to the first passive component through the second and fourth connection members.

2. The fan-out semiconductor device of claim 1, wherein the first passive component is disposed to at least partially overlap the semiconductor chip when viewed from a stacking direction along which the first and second connection members are stacked.

3. The fan-out semiconductor device of claim 1, wherein the fan-out semiconductor package further includes a second passive component disposed in the first connection member and electrically connected to the connection pads, and
   the second passive component has a thickness lower than that of the first passive component.

4. The fan-out semiconductor device of claim 3, wherein the first connection member includes a first insulating layer having a third through-hole in which the second passive component is disposed, a first redistribution layer and a second redistribution layer disposed on opposite surfaces of the first insulating layer, respectively, a second insulating layer disposed on the first insulating layer and covering the first redistribution layer, a third redistribution layer disposed on the second insulating layer, a third insulating layer disposed on the first insulating layer and covering the second redistribution layer, and a fourth redistribution layer disposed on the third insulating layer, and
   the first to fourth redistribution layers are electrically connected to the connection pads.

5. The fan-out semiconductor device of claim 4, wherein the first insulating layer has a thickness greater than that of the second insulating layer.

6. The fan-out semiconductor device of claim 1, wherein the fan-out semiconductor package further includes a metal layer disposed on the first encapsulant and covering an upper region of the inactive, surface of the semiconductor chip, and
   the metal layer is electrically connected to ground patterns of the first connection member through vias penetrating through the first encapsulant.

7. The fan-out semiconductor device of claim 1, the fan-out semiconductor package further includes first connection terminals disposed on the second connection member and electrically connected to the redistribution layer of the second connection member, and the first connection terminals electrically connect the second and fourth, connection members to each other.

8. The fan-out semiconductor device of claim 7, wherein the fan-out semiconductor package further includes a first passivation layer disposed on the second connection member and having first openings exposing at least portions of the redistribution layer of the second connection member and a first underbump metal layer formed in the first openings and electrically connected to the opened redistribution layer of the second connection member, and the first connection terminals are disposed on the first passivation layer and are connected to the first underbump metal layer.

9. The fan-out semiconductor device of claim 1, wherein the fan-out component package further includes a rear redistribution layer disposed on the second encapsulant and electrically connected to the redistribution layer of the third connection member and second connection terminals disposed on the second encapsulant and electrically connected to the rear redistribution layer, and the second connection terminals are formed in both of a fan-in region and a fan-out region.

10. The fan-out semiconductor device of claim 9, wherein the fan-out component package further includes a second passivation layer disposed on the second encapsulant and having second openings exposing at least portions of the rear redistribution layer and a second underbump metal layer formed in the second openings and electrically connected to the opened rear redistribution layer, and the second connection terminals are disposed on the second passivation layer and are connected to the second underbump metal layer.

11. The fan-out semiconductor device of claim 9, wherein the number of first passive components is plural, and the fan-out component package further includes a through-wiring penetrating through the second encapsulant between the plurality of first passive components and the fourth connection member and electrically connecting the redistribution layer of the fourth connection member and the rear redistribution layer to each other.

12. The fan-out semiconductor device of claim 1, wherein the semiconductor chip includes connection pads for a ground and connection pads for a signal, and the first passive component includes a first electrode electrically connected to the connection pads for a ground through heat dissipation vias formed in the second connection member and a second electrode electrically connected to the connection pads for a signal through signal vias formed in the second connection member.

13. The fan-out semiconductor device of claim 12, wherein the semiconductor chip includes a power management integrated circuit (PMIC), and the first passive component includes a capacitor.

14. The fan-out semiconductor device of claim 1, wherein the first passive component is disposed vertically below the semiconductor chip.

15. A fan-out semiconductor device comprising:
a fan-out semiconductor package including:
a first connection member including one or more insulating layers and having a first through-hole penetrating through the one or more insulating layers, a semiconductor chip disposed in the first through-hole and having an active surface having connection pads disposed thereon and an inactive surface opposing the active surface, a first encapsulant encapsulating at least portions of the semiconductor chip, and a second connection member disposed on the first connection member and the active surface of the semiconductor chip, the first and second connection members including, respectively, redistribution layers electrically connected to the connection pads; and a fan-out substrate including:
a third connection member including one or more insulating layers, and having a second through-hole penetrating through the one or more insulating layers of the third connection member, a second encapsulant covering the third connection member and blocking one side of the second through-hole, and a fourth connection member disposed on the third connection member, including one or more insulating layers, and having a third through-hole extending from the other side of the second through-hole to penetrate through the one or more insulating layers of the fourth connection member, the third and fourth connection members including, respectively, redistribution layers electrically connected to the connection pads, wherein the fan-out semiconductor package is stacked on the fan-out substrate so that the second connection member faces the fourth connection member, a passive component electrically connected to the second connection member is disposed in the second and third through-holes, and the passive component is physically spaced apart from the third and fourth connection members, the first connection member, the second connection member, the fourth connection member, and the third connection member are stacked in an order of the first connection member, the second connection member, the fourth connection member, and the third connection member, and the redistribution layer of the second connection member is disposed on an electrical path between the first passive component and one of the redistribution layer of the first connection member, the redistribution layer of the second connection member, the redistribution layer of the fourth connection member, or the connection pads of the semiconductor chip.

16. The fan-out semiconductor device of claim 15, wherein the fan-out semiconductor package further includes connection terminals disposed on the second connection member and electrically connected to the redistribution layer of the second connection member, the connection terminals electrically connect the second and fourth connection members to each other, and the passive component is connected to the connection terminals.

17. The fan-out semiconductor device of claim 16, wherein the fan-out semiconductor package further includes a passivation layer disposed on the second connection member and having openings exposing at least portions of the redistribution layer of the second connection member and an underbump metal layer formed in the openings and electrically connected to the opened redistribution layer of the second connection member, and the connection terminals are disposed on the passivation layer and are connected to the underbump metal layer.

18. The fan-out semiconductor device of claim 15, wherein the second encapsulant and the passive component are spaced apart from each other.

19. The fan-out semiconductor device of claim 15, wherein the passive component is disposed vertically below the semiconductor chip.

20. The fan-out semiconductor device of claim 15, wherein the passive component is a discrete passive component.

21. The fan-out semiconductor device of claim 1, wherein the first passive component is a discrete passive component.

* * * * *